(12) United States Patent
Riek et al.

(10) Patent No.: US 6,396,267 B1
(45) Date of Patent: May 28, 2002

(54) POLARIZATION TRANSFER BY CROSS-CORRELATED RELAXATION IN SOLUTION NMR WITH VERY LARGE MOLECULES

(75) Inventors: Roland Riek, Rickenbach; Gerhard Wider, Herrliberg; Konstantin Pervushin, Zurich; Kurt Wuethrich, Wallisellen, all of (CH)

(73) Assignee: Bruker AG, Faellanden (CH)

( * ) Notice: Subject to any disclaimer, the term of this patent is extended or adjusted under 35 U.S.C. 154(b) by 0 days.

(21) Appl. No.: 09/487,929

(22) Filed: Jan. 19, 2000

(30) Foreign Application Priority Data

Feb. 18, 1999 (EP) .............................. 99103142

(51) Int. Cl.$^7$ ................................................ G01V 3/00
(52) U.S. Cl. ........................................ 324/307; 324/309
(58) Field of Search ................................ 324/307, 309, 324/318, 322

(56) References Cited

U.S. PATENT DOCUMENTS 5,338,687 A * 8/1994 Lee et al. .................... 436/173
6,133,736 A * 10/2000 Pervushin et al. .......... 324/307

OTHER PUBLICATIONS

Brueschweiller, Rafael et al. "Molecular Dynamics Monitored by Cross–Correlated Cross Relaxation of Spins . . . " J. Chem. Phys 96 (3), 1758–1766.
Bodenhausen, Geoffrey et al. "Natural Abundance Nitrogen—15 NMR . . . " Chemical Phys. Lett. vol. 69, No. 1, 185–189.
Morris, G. A. et al. "Enhancement Nuclear Magnetic Resonance . . . " J. Am. Chem. Soc. (1979) ICI, 760–762.
Farrar T.C. et al. in *Encyclopedia of NMR* eds. Grant, D.M. et al., Wiley, N.Y. 1966 vol. 6, pp. 4101–4107.
Müller, L. "Sensitivity Enhanced Detection . . . " J. Am. Chem. Soc 101, 4481–4484.
Boyd, J. et al. "Influence of cross correlation . . . " Chem. Phys. Lett., 175, 477–482.
Pervushin, Konstantin et al. "Attenuated $T_2$ Relaxation . . . " Proc. Nat. Acad. Sci 94, 12366–12371.
Goldman, M. "Interference Effects . . . " J. Mag. Res. 60 (1984) 437–452.

* cited by examiner

*Primary Examiner*—Jay Patidar
*Assistant Examiner*—Brij B. Shrivastav
(74) *Attorney, Agent, or Firm*—Paul Vincent (57) ABSTRACT

A method for performing polarization transfer in NMR experiments with coupled spin ½ nuclei I and S being irradiated by a sequence of rf pulses comprising a first 90° pulse exciting the spins of the nuclei I and after a delay time a further 90° pulse exciting the spins of the nuclei S is characterized in that there is no inversion pulse acting on the spins of the nuclei S during a time period T between the first 90° pulse exciting the spins of the nuclei I and either the further 90° pulse exciting the spins of the nuclei S or a second 90° pulse acting on the spins of the nuclei I, and that the length of the time period T is chosen such that $$d/dT[\sqrt{\sinh(R_C T)^2 + \sin(\pi J_{IS} T)^2} \exp(-R_I T)]$$

is minimized, where

$R_C$ is the transverse cross-correlation-relaxation rate of nuclei I, $R_I$ is the total transverse relaxation rate of nuclei I and $J_{IS}$ is the scalar coupling constant between nuclei I and S.

This provides a novel polarization transfer element which can be used as a "building block" for a great variety of complex NMR experiments including macromolecules with molecular weights far beyond 100000 and yielding higher sensitivity in comparison with methods according to the state of the art such as INEPT.

13 Claims, 5 Drawing Sheets

POLARIZATION TRANSFER BY CROSS-CORRELATED RELAXATION IN SOLUTION NMR WITH VERY LARGE MOLECULES

This application claims Paris convention priority of European Patent Application No. 99 103 142.8 filed on Feb. 18, 1999, the complete disclosure of which is hereby incorporated by reference.

BACKGROUND OF THE INVENTION

The invention refers to a method for performing polarization transfer in a nuclear magnetic resonance (=NMR) experiment with spin systems of large molecules, especially biological macromolecules in solution, comprising at least two kinds of spin ½ nuclei I and S being coupled to each other, the spin system being subjected to a homogeneous magnetic field $B_0$, being irradiated by a sequence of radio frequency (=rf) pulses comprising a first 90° pulse exciting the spins of the nuclei I and after a delay time a further 90° pulse exciting the spins of the nuclei S.

Such a method is used in the INEPT-type experiments published by Morris and Freeman, J. Am. Chem. Soc. 101, (1979) p. 760–762, describing magnetisation transfer via spin-spin couplings.

For the study of large biological macromolecules, the INEPT sequence is nowadays widely used as transfer element for heteronuclear NMR experiments. However, for molecular weights beyond 100000, the transfer time becomes a limiting factor and the INEPT sequence will fail to yield good results.

It is therefore an object of the present invention, to improve the INEPT method and provide a novel polarization transfer element which can be used as a "building block" for a great variety of complex NMR experiments including macromolecules with molecular weights far beyond 100000 and yielding higher sensitivity in comparison with methods according to the state of the art.

SUMMARY OF THE INVENTION

The objects of the present invention are achieved in that the sequence of rf pulses is chosen such that there is no inversion pulse acting on the spins of the nuclei S during a time period T between the first 90° pulse exciting the spins of the nuclei I and either the further 90° pulse exciting the spins of the nuclei S or a second 90° pulse acting on the spins of the nuclei I, and that the length of the time period T is chosen such that $$d/dT[\sqrt{\sin h(R_C T)^2 + \sin(\pi J_{IS} T)^2} \exp(-R_I T)]$$

is minimized, where $R_C$ is the transverse cross-correlation-relaxation rate of nuclei I, $R_I$ is the total transverse relaxation rate of nuclei I and $J_{IS}$ is the scalar coupling constant between nuclei I and S.

Thus, the main features of the INEPT method transferring magnetization via spin-spin couplings can be combined with the advantages of cross-correlated relaxation-induced polarization transfer. This combination can be mainly achieved by the omission of the refocussing and inversion pulses during the time period T. This is, at the first glance, surprising because of the usual idea that those pulses are in any case necessary for the detection of magnetization after the application of the rf pulse sequence since during the time period T the magnetization components disperse and are hence attenuated to a large degree. However, the method according to the present invention has turned out to work anyway with large molecules, since there seems to be still enough magnetization despite the omission of a refocussing mechanism, because the inventional rf sequence more than compensates the mentioned signal losses.

In a preferred variant of the inventional method, a magnetic field gradient $G_1$ is applied within the time period T, allowing to eliminate artefacts.

In another preferred variant of the invention a 180° pulse acting on the nuclei I is irradiated in the middle of the time period T, thus refocussing the magnetization due to the chemical shift and selecting only the magnetization transfer by cross-correlated relaxation.

An improved version of this variant is characterized in that a magnetic field gradient $G_1$ is applied within the time period T/2 before the 180° pulse and another magnetic field gradient $G_1$ is applied within a time period T/2 after the 180° pulse, whereby artefacts can be efficiently eliminated.

In order to obtain single quantum coherence, in another variant of the inventional method the further 90° pulse exciting the spins of nuclei S is irradiated at the same time as the second 90° pulse acting on the spins of the nuclei I.

Alternatively, the inventional method can be performed such that the further 90° pulse exciting the spins of nuclei S is following up the second 90° pulse acting on the spins of the nuclei I after a time delay.

In an improved version of this variant, a magnetic field gradient $G_2$ being applied within the delay time between the second 90° pulse acting on the spins of the nuclei I and the further 90° pulse exciting the spins of nuclei S. This leads to the elimination of magnetization components at the end of the sequence, which are of no interest in the experiment.

In another alternative variant of the inventional method, the further 90° pulse exciting the spins of nuclei S is irradiated after the time period T following up the first 90° pulse exciting the spins of nuclei I, and the second 90° pulse acting on the spins of the nuclei I is being omitted, thus allowing to obtain zero and double quantum coherence.

Another preferred variant of the method according to the present invention is characterized in that the sequence of rf pulses comprises a 180° pulse acting on the nuclei I irradiated at the same time as the further 90° pulse exciting the spins of nuclei S after the time period T following up the first 90° pulse exciting the spins of nuclei I and that the second 90° pulse acting on the spins of nuclei I is irradiated after a second time period T following up the 180° pulse acting on the nuclei I. This allows refocussing the evolution of the magnetization due to the chemical shift.

In an improved version of this variant, a magnetic field gradient $G_1$ is applied within the first time period T and another magnetic field gradient $G_1$ is applied within the second time period T, thereby eliminating artefacts.

In a preferred variant, at the beginning of the experiment before the irradiation of the first 90° pulse exciting the spins of nuclei I a 90° pulse acting on the spins of the nuclei S is irradiated followed up by the application of a magnetic field the S-magnetization is excluded from the further evolution of spins in the system under observation.

It can be of advantage to the inventional method, when the sequence of rf pulses comprises a part adapted to suppress NMR signals of a solvent.

Also may it be of advantage, when the sequence of rf pulses comprises a part adapted to maintain the magnetization of a solvent along the homogeneous magnetic field $B_0$.

DETAILED DESCRIPTION OF THE PREFERRED EMBODIMENTS

In common multidimensional NMR experiments for studies of biological macromolecules in solution, magnetization transfers via spin-spin couplings (INEPT) are key elements of the pulse schemes. For molecular weights beyond 100'000, transverse relaxation during the transfer time may become a limiting factor. This invention presents a novel transfer technique for work with big molecules, called CRINEPT, which largely eliminates the size limitation of INEPT transfers with the use of cross-correlated relaxation-induced polarization transfer. The rate of polarization transfer by cross-correlated relaxation is inversely proportional to the rotational correlation time, so that it becomes a highly efficient transfer mechanism for solution NMR with very high molecular weights. As a first implementation, [$^{15}$N, $^1$H]-correlation experiments were designed that make use of cross-correlation between dipole-dipole coupling and chemical shift anisotropy of the $^{15}$N-$^1$H-moieties for both CRINEPT and TROSY. When compared with INEPT-based [$^{15}$N,$^1$H]-TROSY these new experiments yielded up to three-fold signal enhancement for amide groups of a 110000 MW protein in aqueous solution at 4° C., which has a rotational correlation time of about 70 ns. CRINEPT opens new avenues for solution NMR with supramolecular structures such as, for example, membrane proteins solubilized in micelles or lipid vesicles, proteins attached to nucleic acid fragments, or oligomeric proteins.

Structure determination of proteins by NMR in solution (Wuithrich, 1986) has so far been limited to the molecular weight range up to approximately 30 kDa (Clore & Gronenborn, 1997), and experiments yielding backbone assignments for $^2$H-labeled proteins up to about 60 kDa have been reported (Shan et al, 1996). In larger molecular species the standard experimental techniques (Bax & Grzesiek, 1993; Wider, 1998) lead to severe sensitivity loss due to transverse relaxation even when optimal isotope-labeling is used (LeMaster, 1994). The situation has recently been improved with the introduction of the TROSY technique, which reduces transverse relaxation during evolution and observation periods in heteronuclear NMR experiments (Pervushin et al., 1997; Salzmann et al., 1998). For example, for $^{15}$N-$^1$H-moieties in proteins, significant reduction of transverse relaxation during the $^{15}$N evolution and amide proton acquisition periods can be achieved at the highest presently available $^1$H frequencies, and nearly complete cancellation is expected at $^1$H frequencies near 1 GHz (Pervushin et al., 1997; Wüthrich, 1998). TROSY has already been applied for detailed NMR studies of a protein with molecular weight above 100 kDa (Salzmann et al., 1998). Theoretical considerations indicate that TROSY will reach its limits at somewhat larger sizes because of rapid transverse relaxation during the INEPT-type (Morris and Freeman, 1979) magnetization transfers via scalar couplings between the different nuclei.

This invention presents a novel transfer technique for work with very large molecules, CRINEPT (Cross RelaxatIoN-Enhanced Polarization Transfer), which is based on cross-correlated relaxation (Goldman, 1984; Wimperis & Bodenhausen, 1989; Boyd et al., 1990; Brüschweiler & Ernst, 1991) and scalar couplings. The performance of cross-correlated relaxation for polarization transfer, CRIPT (cross-correlated relaxation-induced polarization transfer), is investigated for $^{15}$N-$^1$N-moieties using a novel experimental implementation for very large particles in solution, where one has cross correlation between relaxation by dipole-dipole coupling (DD) and by chemical shift anisotropy (CSA). We then describe an initial implementation of CRINEPT in [$^{15}$N,$^1$H]-correlation experiments that make use also of TROSY during $^{15}$N evolution and $^1$H$^N$ acquisition periods. Data sets are recorded for a $^2$H,$^{15}$N-labeled protein with an effective rotational correlation time of about 70 ns.

Theoretical Considerations

Transfer of in-phase $^1$H coherence to anti-phase $^{15}$N coherence in $^{15}$N-$^1$H-moieties by cross-correlation between DD and CSA relaxation (Goldman, 1984; Wimperis & Bodenhausen, 1989; Brüschweiler & Ernst, 1991; Pervushin et al., 1997) is considered. Using the product operator formalism (Sørensen et al., 1983) the spin operator I corresponds to $^1$H, S to $^{15}$N, and the two spins have a scalar coupling constant $J_{IS}$ and resonance frequencies ($\omega_I$ and $\omega_S$. For large molecular sizes at high magnetic fields only terms proportional to the spectral density function at zero frequency, J(0), need to be considered (Pervushin et al, 1997). For isotropic rotational tumbling, J(0) is equal to $2\tau_c/5$, where $\tau_c$ is the isotropic rotational correlation time of the molecule. The evolution of in-phase coherence is coupled to the anti-phase coherence via the cross-correlation relaxation rate $R_C$. Starting with in-phase magnetization on spin I at the start of the magnetization transfer period T, $\langle I_x \rangle(0)$, the build-up of anti-phase coherence in CRIPT during T can be described by $$\langle 2I_x S_z \rangle(T) = \sinh(R_C T)\exp(-R_I T)\langle I_x \rangle(0), \quad \text{with} \quad (1)$$

$$R_I = \frac{2}{5}\left[\frac{2}{9}(\gamma_I B_0 \Delta\sigma_I)^2 + \frac{1}{2}(\hbar\gamma_I\gamma_S/r_{IS}^3)^2\right]\tau_c + \frac{1}{2T_{1S}} + \frac{1}{T_{2I}} \quad \text{and} \quad (2)$$

$$R_C = \frac{4}{15}(\gamma_I B_0 \Delta\sigma_I)^2(\hbar\gamma_I\gamma_S/r_{IS}^3)\tau_c, \quad (3)$$

where $r_{IS}$ is the distance between the two nuclei involved, $\Delta\sigma_I$ the CSA tensor of nucleus I, $B_0$ the static magnetic field, and $\gamma_I$ and $\gamma_S$ are the gyromagnetic ratios of I and S. $T_{2I}$ and $T_{IS}$ account for the transverse relaxation of spin I and the longitudinal relaxation time of spin S.

The relative efficiencies of polarization transfer with CRIPT (Eqs. (1)–(3)) or with INEPT (Morris and Freeman, 1979) at variable rotational correlation times $\tau_c$ are compared in FIG. 1a. The build-up of anti-phase magnetization in INEPT is described by $$<2I_y S_z>(T)=\sin(\pi J_{IS}T)\exp(-R_I T)<I_x>(0). \quad (4)$$

Since in Eq. (1) the transfer time T appears always in a product with $\tau_c$, the optimal transfer period for CRIPT is inversely proportional to $\tau_c$. Therefore, with proper adjustment of T the maximal amount of magnetization that can be transferred by CRIPT is independent of the molecular size (FIG. 1a), where one has to consider, however, that the optimal T for $\tau_c$ values shorter than about 20 ns would be unreasonably long. In contrast, the efficiency of INEPT falls off rapidly with increasing size (Eq.(4), FIG. 1a).

The magnetic field dependence of CRIPT for a $^{15}$N-$^1$H-moiety located in a β-sheet of a fully $^{15}$N, $^2$H-labeled protein (FIG. 1b) shows that the maximum theoretical magnetization transfer with CRIPT is about half of the maximum transfer by INEPT, and that maximal CRIPT transfer for a $^{15}$N-$^1$H moiety is obtained at about 1 GHz (Pervushin et al., 1997; Wüthrich, 1998; Salzmann et al., 1998). The FIGS. 1a and 1b further show that CRIPT becomes more efficient than INEPT for molecules with $\tau_c \geq 100$ ns, but that INEPT contributes significantly to the polarization transfer up to $\tau_c \approx 300$ ns.

Figure 1A:
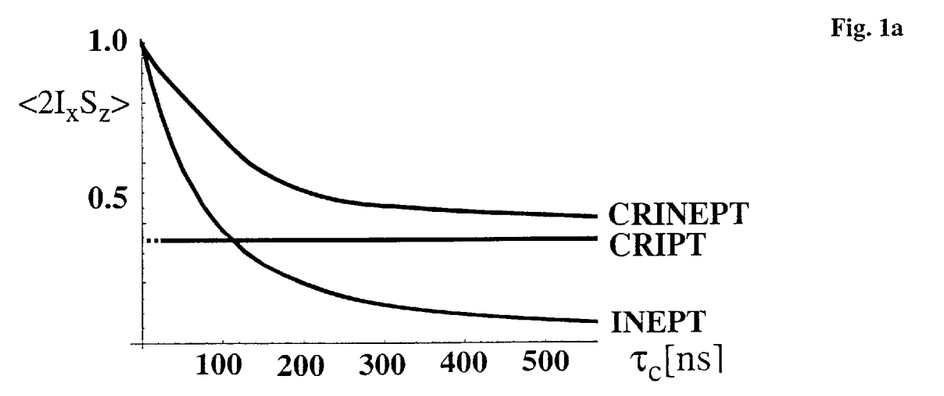
FIG. 1a Plot of the relative magnetization transfer efficiencies using optimal transfer delays T (see Eqs. (1)–(7)) for CRIPT, INEPT and CRINEPT at 750 MHz proton frequency versus molecular size represented by the isotropic rotational correlation time $\tau_c$. The CRIPT graph is shown with a broken line for small $\tau_c$ values, to indicate that the optimal transfer time T would be unreasonably long.
Figure 1B:
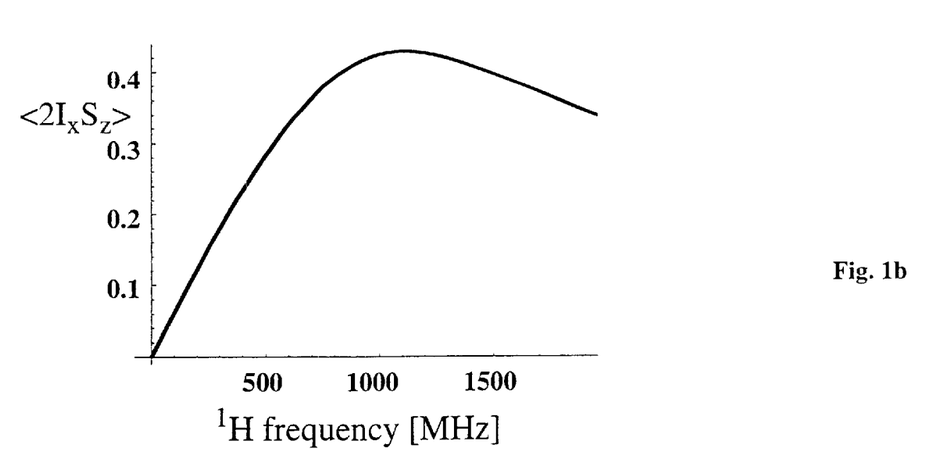
FIG. 1b Plot of the maximal polarization transfer obtainable with CRIPT versus the static magnetic field $B_o$ represented by the corresponding $^1$H frequency. The curves were calculated using Eqs. (1) to (7) for a $^{15}$N-$^1$H-moiety located in a β-sheet of a fully $^{15}$N,$^2$H-labeled protein. The following parameters were used in FIGS. 1a and 1b (Salzmann et al., 1998): $r_{HN}$=1.04 Å, $\Delta\sigma_H$=15 ppm and $\Theta_H$=10°. Remote protons considered are $^1H^N$(i−1), $^1H^N$(i+1) and $^1H^N$(j) at distances of 4.3, 4.3 and 3.3 Å, respectively. These are typical values for a β-sheet in a $^{15}$N,$^2$H-labeled protein, where i is the observed residue, (i−1) and (i+1) are the sequential neighbours and j indicates a long-range contact across the β-sheet (Wüthrich, 1986).

Based on the observations on CRIPT and INEPT in FIGS. 1a and 1b, and considering that systems with $\tau_c$ values in the range 50–300 ns will be of special practical interest, we combined the two polarization transfer mechanisms in CRINEPT, where proton anti-phase coherence is generated during a delay T devoid of radio-frequency pulses, which results in the terms (5) and (6) for the CRINEPT transfer (obtained from the differential equation (32) in Goldman, 1984):

$$<2I_xS_z>(T)=A_{1I}<I_x>(0)=\cos(\pi J_{IS}T)\sin h(R_CT)\exp(-R_IT)<I_x>(0) \quad (5)$$

$$<2I_yS_z>(T)=A_{2I}<I_x>(0)=\sin(\pi J_{IS}T)\cos h(R_CT)\exp(-R_IT)<I_x>(0) \quad (6)$$

Eqs. (5) and (6) are the x- and y-components of the resulting anti-phase magnetization, respectively. The relative orientation of the resulting total magnetization therefore depends on $\tau_c$ and the mixing time T, and the transfer efficiency of CRINEPT represented by the signal amplitude $A_I$ (see FIG. 1a) is proportional to the absolute value of the total anti-phase magnetization:

$$A_I = \sqrt{A^2_{1I}+A^2_{2I}} = \sqrt{\sinh(R_CT)^2+\sin(\pi J_{IS}T)^2}\exp(-R_IT) \quad (7)$$

With Eq. (7) the relative contributions of INEPT and CRIPT to the total polarization transfer can readily be evaluated, whereas Eqs. (5) and (6) contain a mix of polarization transfer via scalar coupling (trigonometric functions) and CRIPT (hyperbolic functions) in both terms. For short $\tau_c$, the rate $R_C$ is negligibly small and only INEPT contributes to CRINEPT, whereas for long $\tau_c$, $R_C$ becomes large and CRIPT is the dominant polarization transfer mechanism (Eq. (3) and FIG. 1a). In principle, CRINEPT is always superior to INEPT or CRIPT (FIG. 1a). However, free proton chemical shift evolution during CRINEPT transfers (FIG. 2c, FIG. 3a and FIG. 3b) has to be handled by additional pulse sequence elements, which may somewhat reduce the overall sensitivity (see below).

Figure 2A:
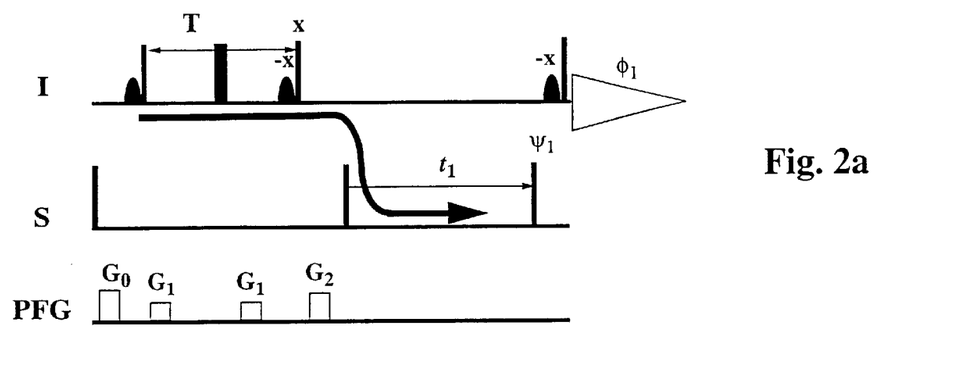
Figure 2B:
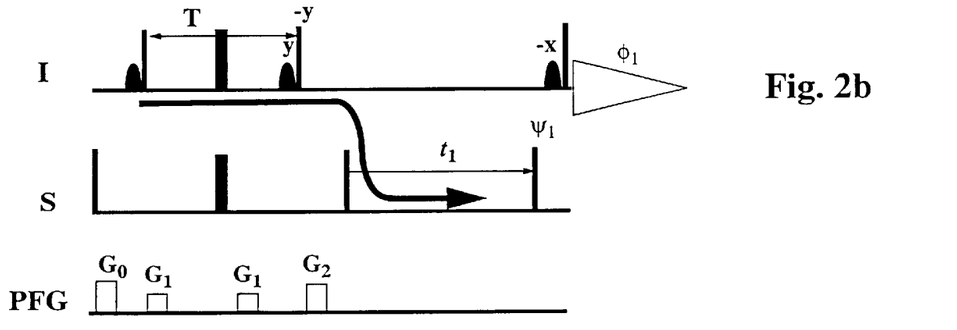
Figure 2C:
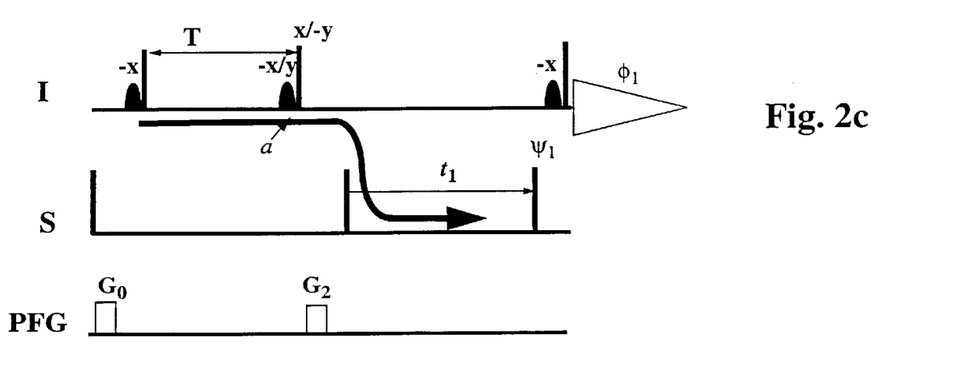

Pulse Schemes for Comparative Studies of Magnetization Transfer by CRIPT, INEPT, and CRINEPT The three experimental schemes in FIGS. 2a–2c were used for measurements of the efficiency of a single transfer from in-phase magnetization on $^1H^N$ to anti-phase magnetization on $^{15}N$ (arrows in FIGS. 2a–2c) by the three transfer types considered in the preceding section. In each of the experiments the $^{15}N$ anti-phase coherence is frequency labelled during $t_1$ and transferred identically to $^1H^N$ anti-phase magnetization with the two 90° pulses on I and S. In all experiments the water magnetization is kept along the z-axis during the whole sequence, using water-selective pulses.

In the novel scheme used for CRIPT (FIG. 2a) the in-phase $^1H^N$ magnetization generated by the first 90° pulse is transferred to anti-phase magnetization by cross-correlated relaxation, according to Eq. (1). The proton chemical shift evolution is refocused by a 180° pulse, which also decouples the protons from $^{15}N$. At the end of the period T, 90° pulses on I and S generate the anti-phase coherence $2I_zS_y$. The magnetization flow can be described in short notation as $I_y \to 2I_yS_z \to 2I_zS_y$ (FIG. 2a).

In the INEPT scheme (FIG. 2b) the flow of coherence is $I_y \to 2I_xS_z \to 2I_zS_y$.

In the CRINEPT transfer measurement (FIG. 2c) the absence of 180° radio frequency pulses during T results in magnetization transfer by cross-correlated relaxation as well as by scalar coupling. In addition, $^1H$ chemical shift evolution occurs during T. The resulting anti-phase coherence at time a can be represented by the density matrix $$\sigma(a)=-2I_xS_z(\cos(\omega_IT)A_{2I}+\sin(\omega_IT)A_{1I})+I_yS_z(-\sin(\omega_IT)A_{2I}\cos(\omega_IT)A_{1I}), \quad (8)$$

where $A_{1I}$ and $A_{2I}$ are given by Eqs. (5) and (6). The CRINEPT transfer efficiency can be measured with two experiments that use, respectively, x or -y phase for the second 90° proton pulse (FIG. 2c). With phase -y, the first term of Eq. (8) is detected, with phase -x the second term.

[$^{15}$N,$^1$H]-correlation Experiments Using CRINEPT and TROSY

For practical applications of CRINEPT we introduced a gradient during the period T (FIG. 3a), which changes Eq. (8) to $$\sigma(a)=-2I_xS_z(\cos(\Gamma+\omega_IT)A_{2I}+\sin(\Gamma+\omega_IT)A_{1I})+2I_yS_z(-\sin(\Gamma+\omega_IT)A_{2I}+\cos(\Gamma+\omega_IT)A_{1I}), \quad (9)$$

The dephasing along the z-axis due to the gradient is indicated by $\Gamma=G_1\gamma_H\tau z$, where $\tau$ is the length of the pulsed field gradient, $G_1$ its strength, and z describes the position of the observed spins along the z-axis. Direct use of the CRINEPT transfer element as shown in FIG. 2c would result in reduced sensitivity, since only half of the components of Eq. (9) can be recovered. In addition, a refocusing element has to be introduced in the pulse sequence to get a phase-sensitive [$^{15}$N,$^1$H]-correlation experiment, as is demonstrated in the [$^{15}$N,$^1$H]-CRINEPT-TROSY experiment of FIG. 3a. Alternatively, when omitting the second 90° proton pulse (FIG. 2c), zero-and double-quantum coherences are generated and all the terms of Eq. (9) can be transferred and refocused as demonstrated in the [$^{15}$N,$^1$H]-CRINEPT-HMQC experiment of FIG. 3b.

Figure 3A:
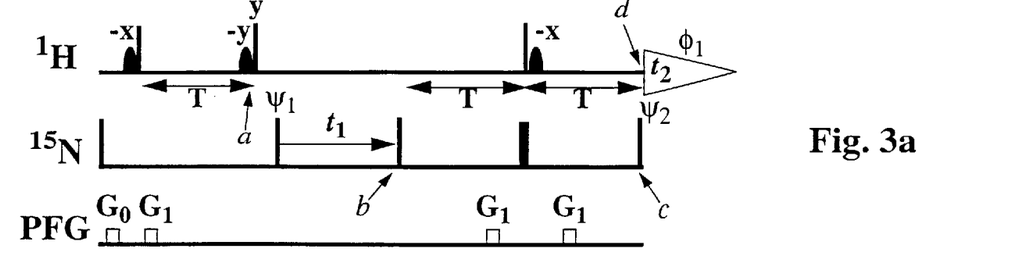

FIG. 3a shows a fully relaxation-compensated CRINEPT-correlation experiment. The following description retains only the magnetization components that lead to a detectable signal during the acquisition period. At time point a of the pulse scheme, after the first time period T, the magnetization is described by Eq. (9). Due to the subsequent pulses only the first term of Eq. (9) is transferred to transverse magnetization on $^{15}$N, which is subsequently frequency-labeled during the time $t_1$, yielding the following terms at time b:

$$\sigma(b)=(2I_zS_y\cos(\omega_St_1)\cos(\pi J_{IS}t_1)+S_x\cos(\omega_St_1)\sin(\pi J_{IS}t_1))\cdot(A_{2I}\cos(\Gamma+\omega_IT)+A_{1I}\sin(\Gamma+\omega_IT)) \quad (10)$$

The CRINEPT-based sequence elements between time points b and d refocus the precession of the proton chemical shift during the first CRINEPT element as well as the effect of the first gradient, and immediately before the last 90° pulse on $^{15}$N the in-phase term of Eq. (10) is transferred to the following coherences:

$$\sigma(c)=2I_yS_z\cos(\omega_St_1)\sin(\pi J_{IS}t_1)(A_{2I}+A_{1I})A_{2S}A_{I_xS_x}+2I_xS_z\cos(\omega_St_1)\sin(\pi J_{IS}t_1)(A_{2I}+A_{1I})A_{1S}A_{I_xS_x} \quad (11)$$

where $A_{I_xS_x}$ accounts for the relaxation of $I_xS_x \cdot A_{2S}$ and $A_{1S}$ are calculated with Eqs. (5) and (6) after exchange of the indices I and S, using the relaxation rates $R_I$ and $R_C$ (Eqs. (2) and (3)). Finally, applying the last 90° pulse on $^{15}$N with the phase $\Psi_2$=x+arc tan$(A_{2S}/A_{1S})$ the following proton anti-phase coherence is generated ($A_S$ is calculated with Eq. (7) by replacement of the indices I with S):

$$\sigma(d)=2I_xS_z\cos(\omega_St_1)\sin(\pi J_{IS}t_1)(A_{2I}+A_{1I})A_SA_{I_xS_x} \quad (12)$$

The anti-phase term of Eq. (10) is transformed to in-phase:

$$\sigma(d)=I_y\cos(\omega_St_1)\cos(\pi J_{IS}t_1)(A_{2I}+A_{1I})A_IA_{I_zS_z} \quad (13)$$

where $A_{I_zS_z}$ accounts for the reduction of the signal amplitude by relaxation of the $S_zI_z$ state during the first period T within the refocusing element of FIG. 3a. The in-phase and anti-phase components in Eqs. (12) and (13) are separated by recording two FIDs with inverted phase $\Psi_2$ (FIG. 3a).

Figure 3B:
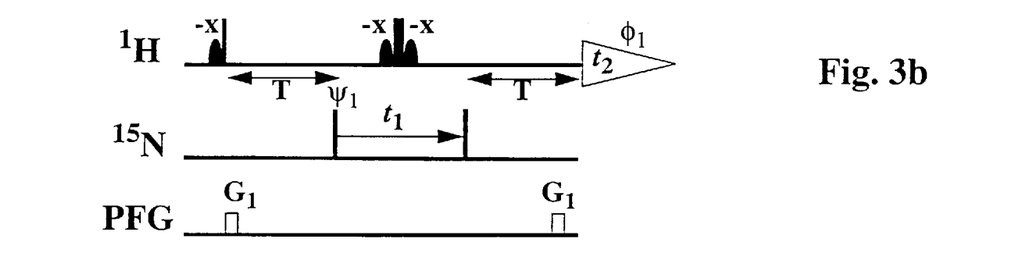

In the [$^{15}$N,$^1$H]-CRINEPT-HMQC experiment of FIG. 3b both transfer elements are based on CRINEPT and the different phases and chemical shift modulations obtained with the transfer method of Eq. (9) are optimally refocused by the 180° pulse on protons and the second CRINEPT element. The experiment is based on [$^{15}$N,$^{1}$H]-HMQC (Müller, 1979), which does not contain TROSY compensation during the $^{15}$N evolution period but benefits from the absence of DD relaxation during the multiple quantum state.

Experimental

The NMR experiments were recorded with 7,8-dihydroneopterin Aldolase from *Staphylococcus aureus*. This protein is a homo-octamer with subunits of 121 amino acid residues. For the experiments in this paper it was uniformly isotope-labeled with $^{15}$N and in the extent of 75% with $^{2}$H, and it was studied at 4° C. in H$_2$O using a protein concentration of 0.4 mM. Based on $T_1$ and $T_2$ relaxation measurements of $^{15}$N (Kay et al., 1989) at 20° C., the rotational correlation time $\tau_c$ under the conditions of the present experiments was estimated to be 70 ns. All NMR spectra were measured on a Bruker DRX-750 spectrometer equipped with four radio-frequency channels and a shielded pulsed field gradient along the z-direction.

Results

Magnetization transfer by CRIPT, INEPT and CRINEPT

Figure 4:
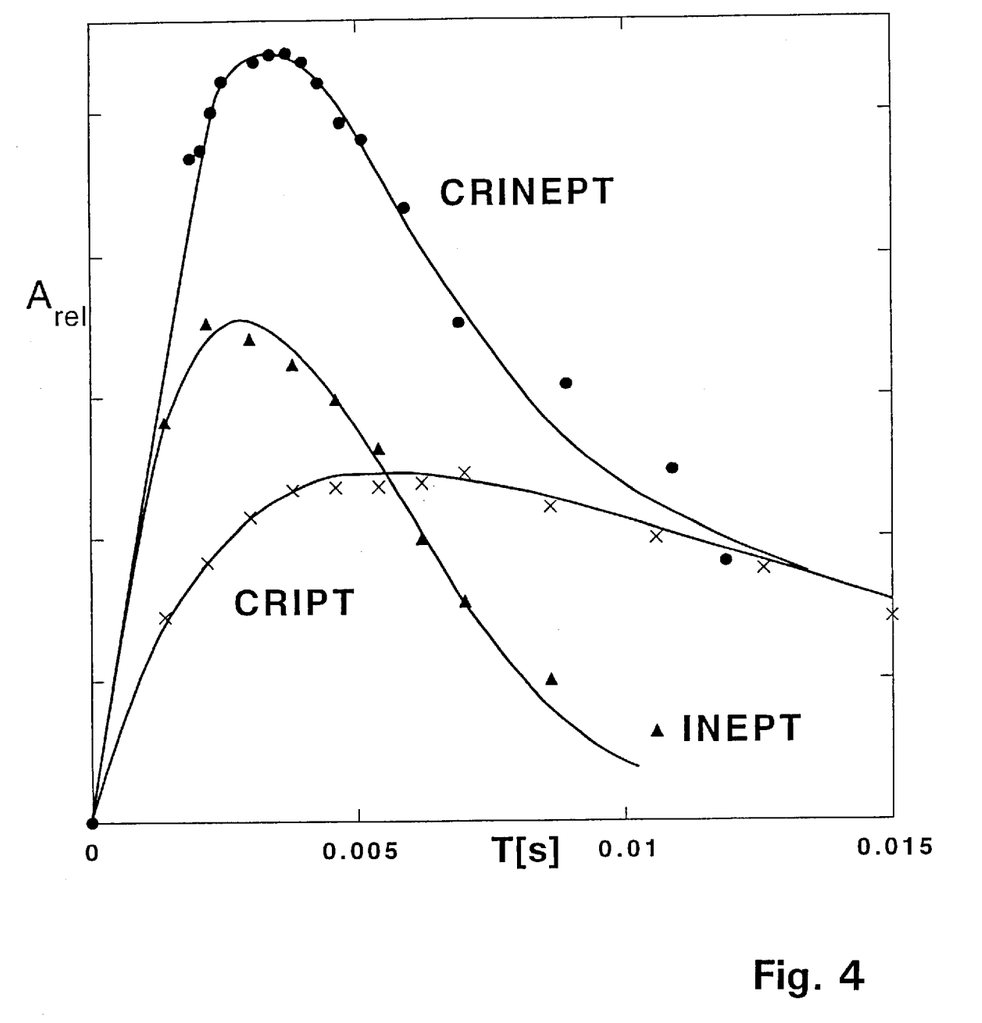
FIG. 4 Build-up curves of magnetization transfer for CRIPT, INEPT and CRINEPT for the well resolved $^{15}$N-$^1$H cross peak of $^{15}$N,$^2$H-labeled S. aureus aldolase at $\omega_1$($^{15}$N)= 121.0 ppm, $\omega_2$($^1$H)=11.1 ppm measured at 750 MHz (protein concentration 0.4 mM, solvent H$_2$O, T=4° C.). The build-up curves were obtained from serial measurements with the pulse sequences of FIG. 2 at variable T values. For CRINEPT two FIDs with phase shifts of −x and y, respectively, were measured for each increment of $t_1$ (FIG. 2c). The two subspectra thus obtained are cosine- or sine-modulated with regard to the proton chemical shift evolution during the time period $t_1$, and were used to calculate the absolute value intensity of the individual cross peaks (Eq. (7)). CRIPT, INEPT and CRINEPT build-up curves were fitted using Eqs. (1), (4) and (7), respectively, using $R_C$=236+/−10 s$^{-1}$ and $R_f$=172+/−13 s$^{-1}$ for CRIPT, $R_C$=254+/−18 s$^{-1}$ for IN-EPT, and $R_C$=238+/−13 s$^{-1}$ and $R_f$=153+/−13 s$^{-1}$ for CRINEPT.

To provide a foundation for the use of CRINEPT, we evaluated the optimal transfer times T for each of the three transfer mechanisms of FIGS. 2a–2c in a macromolecular system with an effective rotational correlation time of about 70 ns, using the $^{15}$N,$^{2}$H-labeled *S. aureus* aldolase in H$_2$O solution at 4° C. The transfer efficiencies were measured from serial experiments using the pulse sequences in FIGS. 2a–2c with variable transfer times T. The build-up curve for CRIPT from 0 to 15 ms shows a fast increase followed by a plateau and an exponential decay, which corresponds to Eq. (1) as demonstrated by the close fit obtained with the simulation (FIG. 4). The optimal transfer delay is about 6 ms, with an observed range of 4 to 13 ms for different $^{15}$N-$^{1}$H groups in the aldolase.

For INEPT transfer with the same $^{15}$N-$^{1}$H-moiety as shown for CRIPT, the optimal delay is about 3 ms (FIG. 4), and only about 50% of the maximal transfer that would be obtainable with-out relaxation is achieved (FIGS. 1a and 4)). Nonetheless, for the presently studied system with $\tau_c$=70 ns the observed INEPT transfer maximum exceeds the maximal CRIPT transfer about 1.5-fold (FIG. 4).

The experiments with CRINEPT (FIG. 4) and the fitting of Eq. (9) to the measured build-up confirm the theoretical prediction (FIG. 1a) that CRINEPT is superior to INEPT and CRIPT for all correlation times, provided that all coherences of Eq. (9) can be used further in the experiment. In the system of FIG. 4 the optimal transfer delay for CRINEPT is around 4 ms and thus lies between the optimal T values for the two basic experiments. The relative maximal transfers for CRINEPT, INEPT and CRIPT are about 7.6:5:3.4 (FIG. 4), which coincides well with the theoretical values for a protein with $\tau_c$=70 ns (FIG. 1a).

[$^{15}$N,$^{1}$H]-correlation Experiments with CRINEPT Transfers

The [$^{15}$N,$^{1}$H]-CRINEPT-TROSY experiment (FIG. 3a) includes transverse relaxation-optimization during the transfer delays as well as the evolution periods. Measurements for the peak shown in FIG. 5 gave a two-fold signal increase when compared to [$^{15}$N,$^{1}$H]-TROSY. For other fast relaxing aldolase signals, gains between 1.5 and 3 were obtained. The experimental scheme of FIG. 3a has been designed to select the two multiplet components of the $^{15}$N-$^{1}$H signal indicated by the filled circles in FIG. 5 (Eqs. (12) and (13)). In the spectra obtained with the aldolase the more rapidly relaxing one of these two components is in most signals broadened beyond detection (middle panel of FIG. 5a). Both components could be observed only for one highly flexible backbone $^{15}$N-$^{1}$H-group and for some of the arginine side chains.

Figure 5:
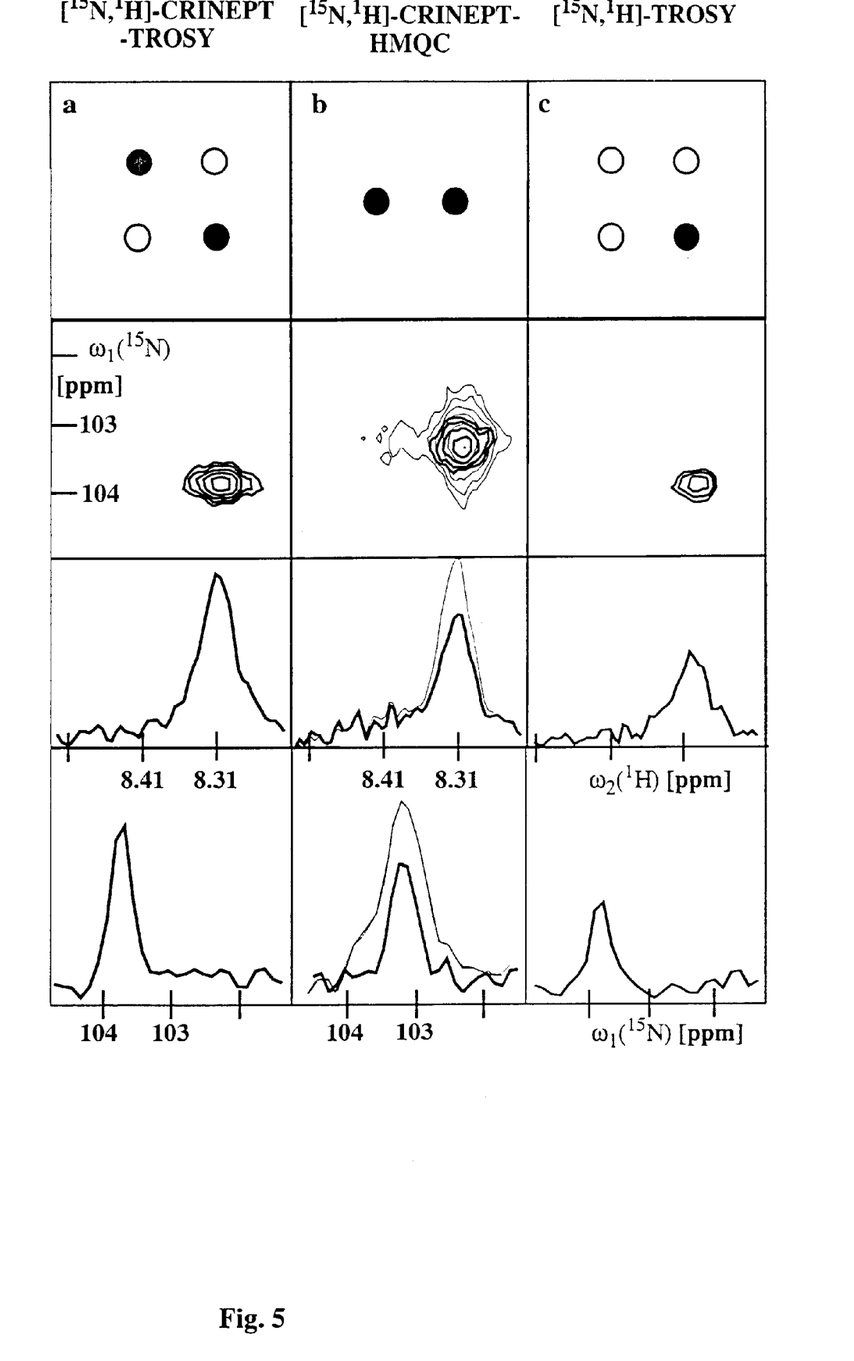

The [$^{15}$N,$^{1}$H]-CRINEPT-HMQC experiment (FIG. 3b) has no loss of magnetization due to proton chemical shift evolution during the CRINEPT element. Since there is no TROSY-compensation in the indirect dimension, there is an approximately two-fold increase of the $^{15}$N-line-width when compared with [$^{15}$N,$^{1}$H]-TROSY (FIG. 5). After application of a strong Gaussian window function in the $^{15}$N-dimension to enforce a comparable $^{15}$N-line-width, a 1.4-fold increase in signal-to-noise was measured when compared to standard [$^{15}$N,$^{1}$H]-TROSY (FIG. 5). Two multiplet peaks per $^{15}$N-$^{1}$H-moiety are expected, since no decoupling is applied during acquisition (FIG. 3b). However, due to the fast relaxation of the lower-field component during the transfer elements and the $t_1$-evolution, only the slowly relaxing component was detectable for most $^{15}$N-$^{1}$H groups in the aldolase (FIG. 5b). This [$^{15}$N,$^{1}$H]-correlation peak is in a different position from those of any of the components of the 4-line signal, i.e., it is shifted about 45 Hz upfield along $\omega_1$($^{15}$N) when referenced to the TROSY-component (FIG. 5).

Discussion

Currently, nearly all heteronuclear multidimensional NMR experiments use INEPT to transfer magnetization between different spin species (Wider, 1998), but the efficiency of INEPT deteriorates with increasing rotational correlation time $\tau_c$ (FIG. 1a). In contrast, transfer of polarization by CRIPT is independent of $\tau_c$. Further, in amide groups the efficiency of CRIPT increases with the strength of the external magnetic field up to about 1 GHz proton frequency, whereas the sensitivity of the INEPT transfer deteriorates further due to increased CSA relaxation. The present experiments with the 110 kDa *S. aureus* aldolase confirm the theoretical considerations of FIGS. 1a and 1b, showing that for molecules with rotational correlation times from approximately 50 to 300 ns both INEPT and CRIPT promote substantial polarization transfer between $^{1}$H and $^{15}$N in amide groups, which is exploited in CRINEPT.

The two CRINEPT-based [$^{15}$N,$^{1}$H]-correlation experiments presented in FIGS. 3a and 3b can be used as building blocks for a wide variety of NMR experiments with large molecules, which may include simple two-dimensional experiments (Bodenhausen & Ruben, 1980; Ernst et al., 1987, Wüthrich, 1986;), triple-resonance experiments for sequential and intraresidual backbone assignments (Montelione & Wagner, 1989; Ikura et al., 1990; Bax & Grzesiek, 1993), experiments for side chain assignments (Bax et al., 1990; Ikura et al., 1991; Grzesiek & Bax, 1992), as well as experiments for studies of molecular dynamics (Kay et al., 1989; Peng & Wagner, 1992; Kay et al., 1992; Dayie & Wagner, 1994). For example, the [$^{15}$N,$^{1}$H]-CRINEPT-TROSY experiment (FIG. 3a) might be used in triple-resonance experiments, and [$^{15}$N,$^{1}$H]-CRINEPT-HMQC (FIG. 3b) might be the preferred choice in multi-dimensional experiments with short $^{15}$N-evolution periods, such as 3D $^{15}$N-resolved [$^{1}$H,$^{1}$H]-NOESY.

For systems with $\tau_c \geq 300$ ns, CRIPT is predicted to be nearly as sensitive as CRINEPT (FIG. 1a). CRIPT could then also be used as a "filter" to eliminate resonances originating from smaller molecules, since the optimal transfer time T is inversely proportional to $\tau_c$ (Eq. (1)).

Although the present invention is focused on magnetization transfer by cross-correlated relaxation between DD coupling and CSA, more general use of the CRINEPT principle may cover other types of cross-correlated relaxation. Overall, CRINEPT combined with TROSY opens new avenues for NMR studies with molecular weights of several hundred kDa, such as membrane proteins solubilized in micelles or lipid vesicles, proteins attached to large nucleic acid fragments, or oligomeric proteins.

FIGURE CAPTIONS

FIGS. 2a–c Pulse sequences used for direct comparison of polarization transfer by CRIPT (FIG. 2a), INEPT (FIG. 2b) and CRINEPT (FIG. 2c). In each scheme the coherence flow is indicated by a grey curved arrow. The narrow and wide bars indicate non-selective 90° and 180° pulses. Sine-bell shapes represent selective 90° pulses on the water resonance, which keep the water magnetization along the z-axis during the whole sequence (Grzesiek & Bax, 1993). On the line marked PFG, rectangles indicate pulsed magnetic field gradients applied along the z-axis. The S steady state magnetization was suppressed by a 90° pulse on S followed by a pulsed field gradient before the first proton pulse. In (FIG. 2c) two experiments are recorded, one with phase x on the second proton pulse and one with phase −y, as indicated. The phase of the associated water flip back pulse is also changed.

FIG. 3a and 3b [$^{15}$N,$^1$H] correlation experiments using CRINEPT-based polarization transfer. (FIG. 3a) Fully relaxation-optimized [$^{15}$N,$^1$H]-CRINEPT-TROSY. (FIG. 3b) [$^{25}$N,$^1$H]-CRINEPT-HMQC. Narrow and wide black bars indicate non-selective 90° and 180° pulses applied at the proton ($^1$H) or nitrogen ($^{15}$N) frequency. Sine-bell shapes on the line marked $^1$H indicate selective 90° pulses on the water resonance to keep the water magnetization along the z-axis during the whole sequence (Grzesiek & Bax, 1993; Piotto et al., 1992). The optimal length of the period T is set according to Eq. (7), and is typically between 3 and 5.4 ms. On the line marked PFG, rectangles indicate duration and strength of pulsed magnetic field gradients applied along the z-axis (FIG. 3a): $G_0$: 400 μs, 15 G/cm; $G_1$: 400 μs, 15 G/cm. (FIG. 3b): $G_1$: 1000 μs, 30 G/cm. The phase cycles for both experiments are $\phi_1$={x, −x}, $\psi_1$={x, −x}. All other radio-frequency pulses are applied with phase x, unless labeled differently. In FIG. 3a two free induction decays (FID) are recorded for each $t_1$ increment, with $\psi_2$={X, X} and $\psi_2$={−x, −x}, respectively, and added with a 90° phase correction in both dimensions. Quadrature detection in the $^{15}$N($t_1$) dimension is achieved by the States-TPPI method (Marion et al., 1989) applied to the phase $\psi_1$. The water-selective pulses have a Gaussian shape and a length of 1.3 ms.

FIG. 5 Comparison of signal intensity and lines shape for [$^{15}$N,$^1$H]-TROSY (Pervushin et al., 1998), [$^{15}$N,$^1$H]-CRINEPT-TROSY (FIG. 3a) and [$^{15}$N,$^1$H]-CRINEPT-HMQC (FIG. 3b). The data were recorded with the uniformly $^{15}$N, 75% $^2$H-labeled S. aureus aldolase in H$_2$O, T=4° C. at 750 MHz $^1$H frequency and the backbone amide moiety of Gly 43 is shown. Prior to Fourier transformation the three data sets were multiplied with a cosine window function in all dimensions and transformed to a size of 256*2048 complex points using the program PROSA (G üintert et al., 1992). The total measuring time was 4 h per experiment, with $t_{1max}$=50 ms and $t_{2max}$=98 ms, T=5.4 ms, $\psi_2$={x,x} and {−x,−x}, respectively, and an interscan delay of 0.7 s. The panels at the top indicate the peak selections by the three experiments. As indicated by the black circle, for large molecules only the most slowly relaxing component of the four-component signal is detected in TROSY (Pervushin et al., 1997), [$^{15}$N,$^1$H]-CRINEPT-TROSY selects the slowest and fastest relaxing components, and [$^{15}$N,$^1$H]-CRINEPT-HMQC yields a doublet in the proton dimension. The second row of panels from the top shows contour plots of the spectral region containing the signal of one of the backbone $^{15}$N-$^1$H groups. The two rows of panels in the lower half of the figure show cross sections along $\omega_2$($^1$H) and along $\omega_1$($^{15}$N) through the peaks shown in the contour plots. In (b) two peaks are displayed, where the thin lines show the signal obtained with identical data handling as for the other two experiments, and the thick lines the result obtained using a strong Gaussian window function in the $^{15}$N dimension prior to Fourier transformation, so as to obtain the same linewidth as for TROSY (see text).

We claim:

1. A method for performing polarization transfer in a nuclear magnetic resonance (=NMR) experiment with spin systems of large molecules, especially biological macromolecules in solution, comprising at least two kinds of spin ½ nuclei I and S being coupled to each other, the spin system being subjected to a homogeneous magnetic field $B_0$, being irradiated by a sequence of radio frequency (=rf) pulses comprising a first 90° pulse exciting the spins of the nuclei I and after a delay time a further 90° pulse exciting the spins of the nuclei S, characterized in that the sequence of rf pulses is chosen such that there is no inversion pulse acting on the spins of the nuclei S during a time period T between the first 90° pulse exciting the spins of the nuclei I and either the further 90° pulse exciting the spins of the nuclei S or a second 90° pulse acting on the spins of the nuclei I, and that the length of the time period T is chosen such that $$\sqrt{\sinh(R_C T)^2 + \sin(\pi J_{IS} T)^2} \exp(-R_I T)$$

is maximized with respect to T, where $R_C$ is the transverse cross-correlation-relaxation rate of nuclei I $R_I$ is the total transverse relaxation rate of nuclei I and $J_{IS}$ is the scalar coupling constant between nuclei I and S.

2. The method according to claim 1, characterized by a magnetic field gradient $G_1$ being applied within the time period T.

3. The method according to claim 1, characterized in that a 180° pulse acting on the nuclei I is irradiated in the middle of the time period T.

4. The method according to claim 3, characterized in that a magnetic field gradient $G_1$ is applied within the time period T/2 before the 180° pulse and another magnetic field gradient $G_1$ is applied within a time period T/2 after the 180° pulse.

5. The method according to claim 1, characterized in that the further 90° pulse exciting the spins of nuclei S is irradiated at the same time as the second 90° pulse acting on the spins of the nuclei I.

6. The method according to claim 1, characterized in that the further 90° pulse exciting the spins of nuclei S is following up the second 90° pulse acting on the spins of the nuclei I after a delay time.

7. The method according to claim 6, characterized by a magnetic field gradient $G_2$ being applied within the delay time between the second 90° pulse acting on the spins of the nuclei I and the further 90° pulse exciting the spins of nuclei S.

8. The method according to claim 1, characterized in that the further 90° pulse exciting the spins of nuclei S is irradiated after the time period T following up the first 90° pulse exciting the spins of nuclei I, and that the second 90° pulse acting on the spins of the nuclei I is being omitted.

9. The method according to claim 1, characterized in that the sequence of rf pulses comprises a 180° pulse acting on the nuclei I irradiated at the same time as the further 90° pulse exciting the spins of nuclei S after the time period T following up the first 90° pulse exciting the spins of nuclei I, and that the second 90° pulse acting on the spins of nuclei I is irradiated after a second time period T following up the 180° pulse acting on the nuclei I.

10. The method according to claim 9, characterized by a magnetic field gradient $G_1$ being applied within the first time period T and another magnetic field gradient $G_1$ being applied within the second time period T.

11. The method according to claim 1, characterized in that at the beginning of the experiment before the irradiation of the first 90° pulse exciting the spins of nuclei I a 90° pulse acting on the spins of the nuclei S is irradiated followed up by the application of a magnetic field gradient Go spoiling the initial magnetization of nuclei S.

12. The method according to claim 1, characterized in that the sequence of rf pulses comprises a part adapted to maintain the magnetization of a solvent along the homogeneous magnetic field $B_0$.

13. The method according to claim 1, characterized in that the sequence of rf pulses comprises a part adapted to suppress NMR signals of a solvent.

\* \* \* \* \*